(12) United States Patent
Shih et al.

(10) Patent No.: US 11,834,867 B2
(45) Date of Patent: Dec. 5, 2023

(54) ANTI-THEFT LOCK AND A SERVER WITH THE ANTI-THEFT LOCK

(71) Applicant: Fulian Precision Electronics (Tianjin) Co., LTD., Tianjin (CN)

(72) Inventors: Tung-Ho Shih, New Taipei (TW);
Hung-Wei Chen, New Taipei (TW);
Wei-Chung Chou, New Taipei (TW);
Ming-Heng Lu, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 380 days.

(21) Appl. No.: 17/141,437

(22) Filed: Jan. 5, 2021

(65) Prior Publication Data
US 2022/0064994 A1 Mar. 3, 2022

(30) Foreign Application Priority Data
Aug. 28, 2020 (CN) .......................... 202010888071.5

(51) Int. Cl.
| | | |
|---|---|---|
| E05B 47/00 | (2006.01) | |
| E05B 65/00 | (2006.01) | |
| H05K 5/02 | (2006.01) | |
| H05K 7/14 | (2006.01) | |

(52) U.S. Cl.
CPC ........ *E05B 47/0038* (2013.01); *E05B 65/006* (2013.01); *H05K 5/0221* (2013.01); *H05K 7/1487* (2013.01); *E05Y 2900/20* (2013.01); *H05K 7/1488* (2013.01)

(58) Field of Classification Search
CPC ...... E05B 79/04; E05B 83/243; E05B 85/243; E05B 85/26; E05B 83/24; B62D 25/12
See application file for complete search history.

(56) References Cited

U.S. PATENT DOCUMENTS

| 11,591,823 B2 * | 2/2023 | Promutico ............. D06F 37/42 |
|---|---|---|
| 2007/0215616 A1 | 9/2007 | Chen et al. |
| 2019/0265635 A1 * | 8/2019 | Shiina ................ G03G 21/1633 |

FOREIGN PATENT DOCUMENTS

| CN | 2909355 | 6/2007 |
|---|---|---|
| CN | 104533162 B | 4/2015 |
| CN | 210013588 U | 2/2020 |
| WO | 0131152 A1 | 5/2001 |

* cited by examiner

*Primary Examiner* — Kristina R Fulton
*Assistant Examiner* — Thomas L Neubauer
(74) *Attorney, Agent, or Firm* — ScienBiziP, P.C.

(57) ABSTRACT

An anti-theft lock includes an engaging member arranged on a chassis, a latch module including a connecting member and a latch coupled to the connecting member, a fixing module coupled to the connecting member, a magnetic module arranged on the top cover and used to cooperate with the fixing module to control movement of the connecting member, and an unlocking mechanism including magnetic members. The connecting member is movably arranged on a top cover. The latch is engaged with or separated from the engaging member through movement of the connecting member. The magnetic members are attracted to or repelled from the magnetic module so that the magnetic module fixes or loosens the connecting member. When the connecting member can move, the latch is disengaged from and separated from the engaging member.

20 Claims, 16 Drawing Sheets

ANTI-THEFT LOCK AND A SERVER WITH THE ANTI-THEFT LOCK

FIELD

The subject matter herein generally relates to locking devices, and more particularly to an anti-theft lock.

BACKGROUND

Generally, a cabinet (such as a server cabinet) is assembled to a top cover through simple screws or hooks. However, the screws and hooks are easy to disassemble, which poses risk for theft.

BRIEF DESCRIPTION OF THE DRAWINGS

Implementations of the present disclosure will now be described, by way of embodiments, with reference to the attached figures.

DETAILED DESCRIPTION

Figure 1:
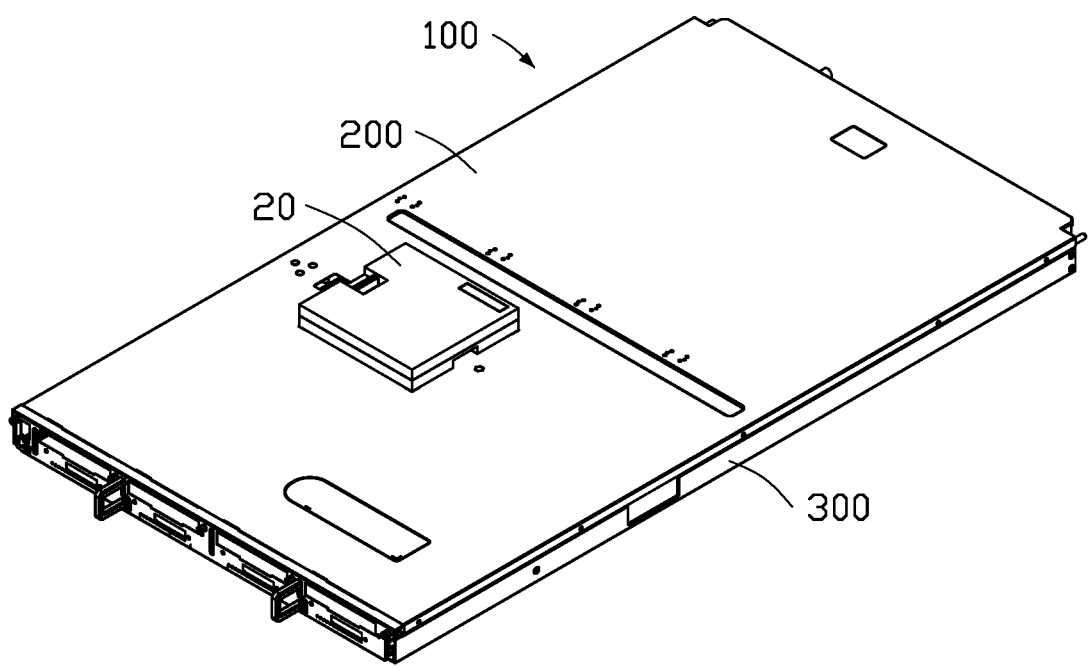
FIG. 1 is a schematic diagram of an anti-theft lock according to an embodiment of the current disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or another word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

Figure 2:
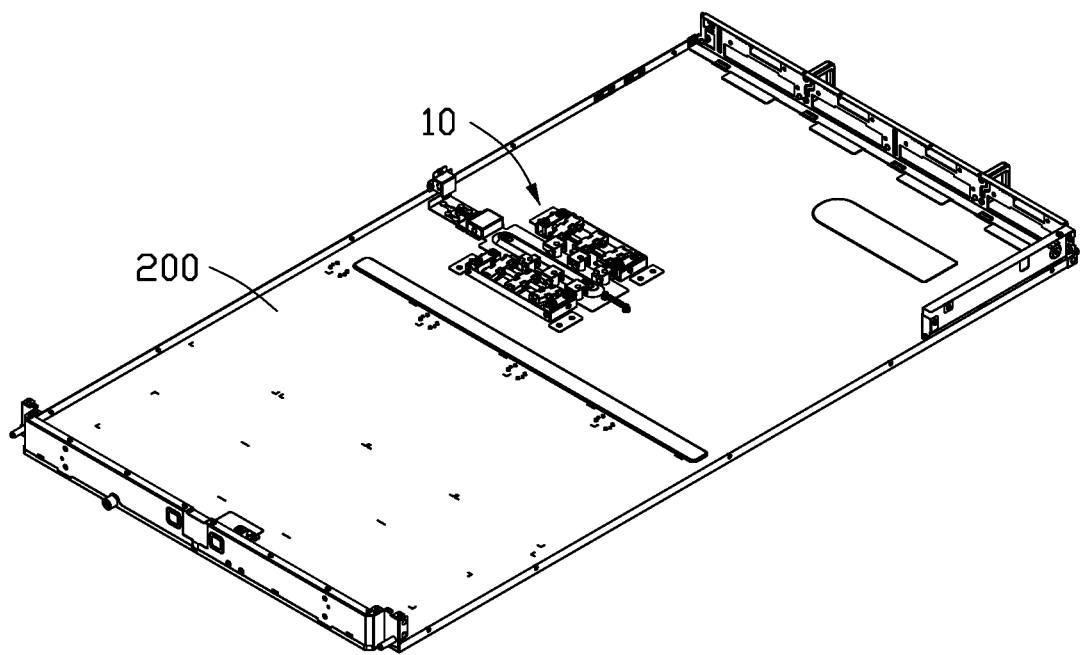
FIG. 2 is a schematic diagram of a portion of the anti-theft lock.

FIGS. 1 and 2 show an embodiment of an anti-theft lock 100 for locking a top cover 200 and a chassis 300 of a server. In one embodiment, the anti-theft lock 100 includes a latch mechanism 10 and an unlocking mechanism 20. One part of the latch mechanism 10 is coupled to the top cover 200, and another part of the latch mechanism 10 is coupled to the chassis 300 for locking the top cover 200 to the chassis 300. The unlocking mechanism 20 is used for unlocking the latch mechanism 10, so that the top cover 200 can be separated from the chassis 300.

Figure 3:
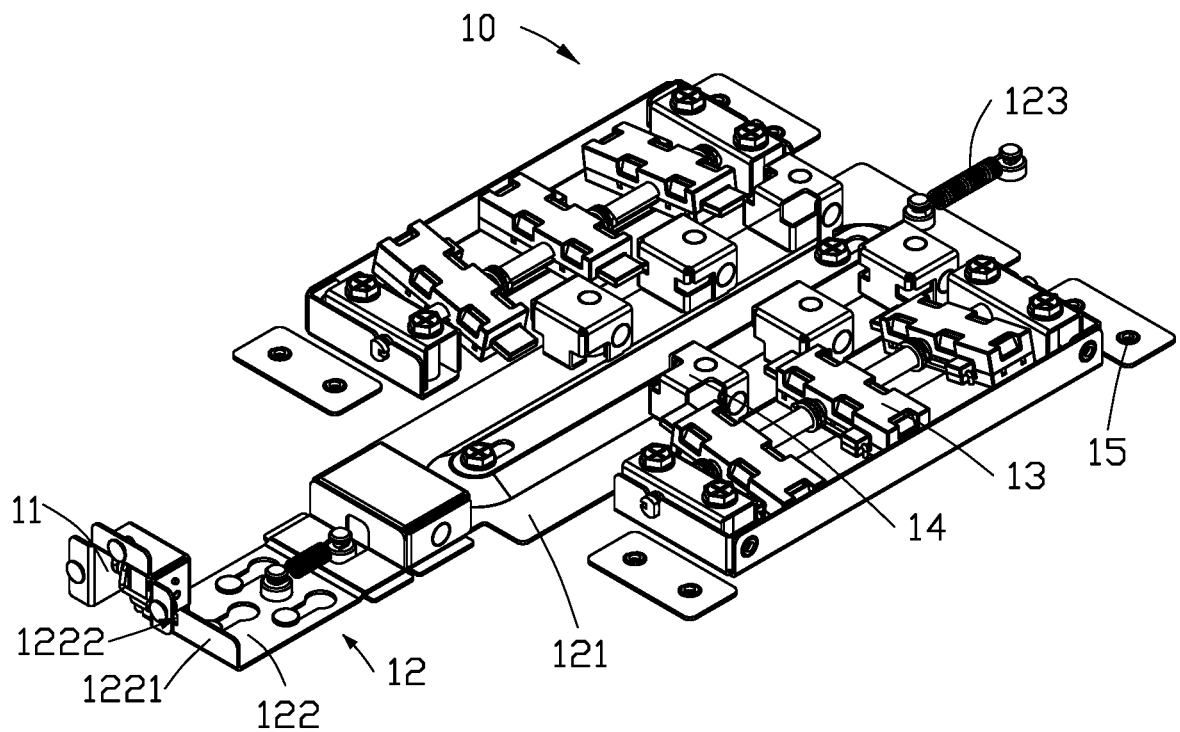
FIG. 3 is a schematic diagram of a latch mechanism of the anti-theft lock.

Referring to FIGS. 2 and 3, the latch mechanism 10 includes an engaging member 11, a latch module 12, a magnetic module 13, and a fixing module 14. The engaging member 11 is coupled to the chassis 300. The latch module 12, the magnetic module 13, and the fixing module 14 are coupled to the top cover 200. The engaging member 11 cooperates with the latch module 12 to realize a locking connection between the top cover 200 and the chassis 300.

Figure 4:
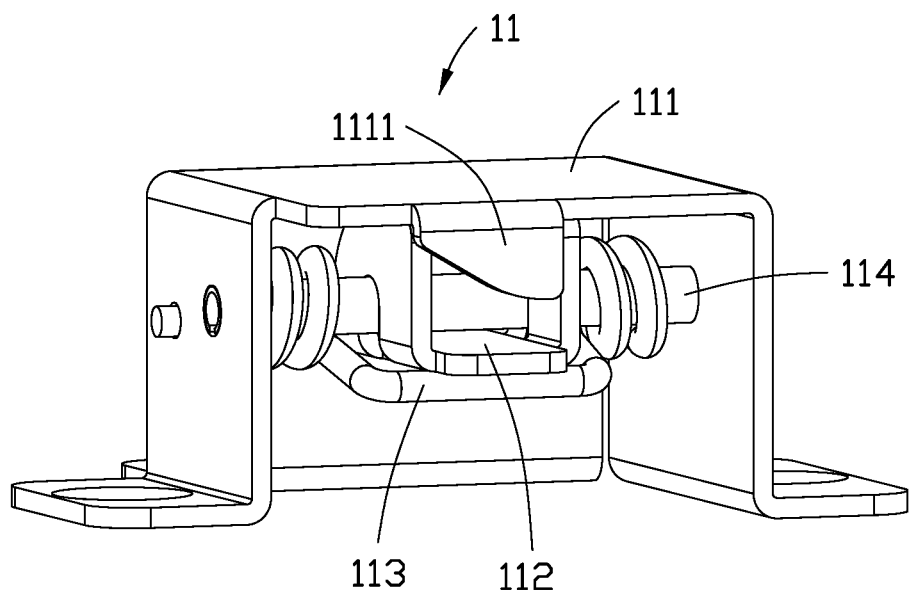
FIG. 4 is a schematic diagram of an engaging member of the anti-theft lock.

Specifically, referring to FIG. 4, the engaging member 11 includes an engaging body 111, a baffle 112 coupled to the engaging body 111, a first torsion spring 113, and a rotating shaft 114. One side of the engaging body 111 includes a first hook 1111. The first hook 1111 is used to hook onto the latch module 12. A slot 1222 is defined on the latch 122. The first hook 1111 is engaged with or separated from the slot 1222 through movement of the connecting member 11. The baffle 112 and the first torsion spring 113 are sleeved on the rotating shaft 114. The first torsion spring 113 is arranged at two ends of the baffle 112. Two ends of the rotating shaft 114 are coupled to the engaging body 111 and are driven by the first torsion spring 113 to rotate. In one embodiment, the first torsion spring 113 is substantially in the shape of " ) ∟ ".

Referring to FIG. 3, the latch module 12 includes a connecting member 121, a latch 122 coupled to one end of the connecting member 121, and two second torsion springs 123 respectively provided at two ends of the connecting member 121. Specifically, the connecting member 121 is slidably coupled to the top cover 200, the latch 122 is provided at an end of the connecting member 121 adjacent to the engaging member 11, and an end of the latch 122 away from the connecting member 121 is provided with a bent portion 1221. A first through hole (not shown) is defined in the bent portion 1221, and the first through hole is used to cooperate with the first hook 1111 to clamp the first hook 1111 to achieve a fixed connection between the top cover 200 and the chassis 300. The second torsion springs 123 are respectively arranged at the two ends of the connecting member 121 to realize an elastic connection between the engaging member 11 and the latch 122. In one embodiment, one end of one of the second torsion springs 123 is coupled to the top cover 200, and one end of the other second torsion spring 123 is coupled to the top cover 200. The latch 122 is used to move the connecting member 121 so that the latch 122 has a certain amount of displacement. In one embodiment, the latch 122 is generally in the shape of "几".

Figure 5:
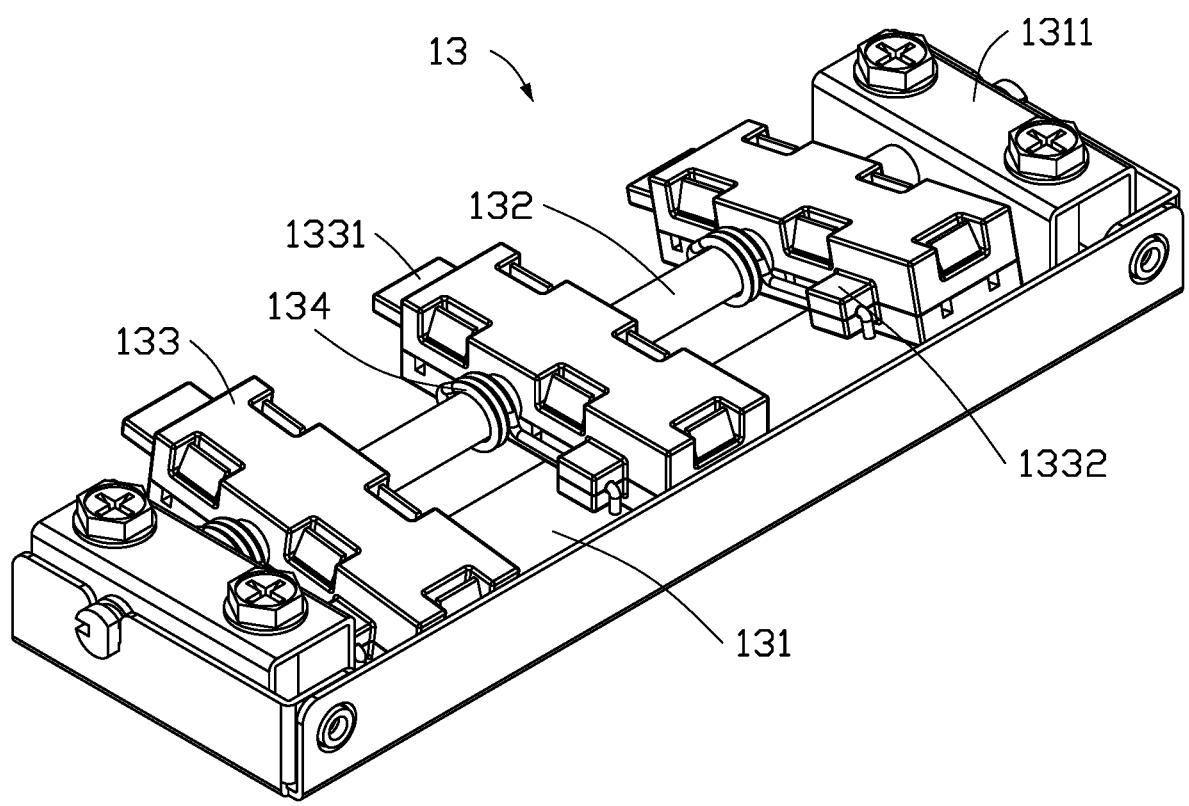
FIG. 5 is a schematic diagram of a magnetic module of the anti-theft lock.

Referring to FIG. 5, the magnetic module 13 includes a fixing member 131, a connecting shaft 132, a plurality of receiving chassis 133 sleeved on the connecting shaft 132, and a third torsion spring 134. The fixing member 131 is coupled to the top cover 200 and arranged on two sides of the connecting member 121 and used for supporting the connecting shaft 132. The fixing member 131 further includes two limiting members 1311 respectively provided at two ends of the fixing member 131 to limit movement of the connecting shaft 132. The connecting shaft 132 is rotationally arranged on the fixing member 131, and two ends of the connecting shaft 132 are respectively coupled to the limiting member 1311. In one embodiment, the connecting shaft 132 is provided with a plurality of ring grooves (not shown), and the ring grooves are used to cooperate with the receiving chassis 133 and the third torsion spring 134. Each receiving chassis 133 includes a first protrusion 1331 and a second protrusion 1332. The first protrusion 1331 is provided at one end of the receiving chassis 133 adjacent to the connecting member 121, and the second protrusion 1332 is provided on a side of the receiving chassis 133 coupled to the connecting shaft 132. The first protrusion 1331 is used to cooperate with the fixing module 14 for matching or restricting a movement of the latch 122, and the second protrusion 1332 is used to cooperate with the third torsion spring 134 so that the third torsion spring 134 drives the receiving chassis 133 to move. One end of the third torsion spring 134 is sleeved on the connecting shaft 132, and another end of the third torsion spring 134 passes through the second protrusion 1332. The third torsion spring 134 is used to drive the receiving chassis 133 to move. In one embodiment, there are three receiving chassis 133 and two magnetic modules 13. The two magnetic modules 13 are symmetrically arranged on two sides of the latch module 12. The magnetic module 13 further includes a magnetic member (not shown) accommodated in the receiving chassis 133. A polar arrangement of the magnetic member is set in the receiving chassis 133 so that the unlocking mechanism 20 cooperates with the receiving chassis 133 to cause the receiving chassis 133 to move in a certain direction.

Figure 6:
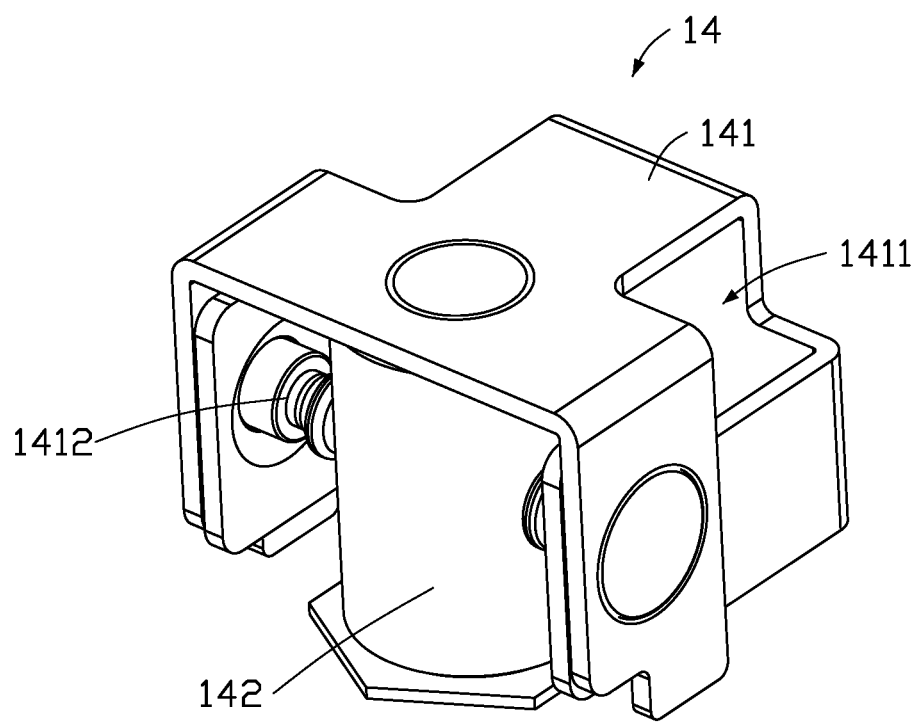
FIG. 6 is a schematic diagram of a fixing module of the anti-theft lock.

Referring to FIG. 6, the fixing module 14 includes an anti-theft member 141 and a matching member 142. The matching member 142 is arranged in the anti-theft member 141, and the matching member 142 is fixedly coupled to the connecting member 121. The anti-theft member 141 is provided with a through groove 1411, and the through groove 1411 is used to hold the first protrusion 1331 so that the receiving chassis 133 has a certain displacement. The anti-theft member 141 further includes a positioning member 1412, and the positioning member 1412 is used to cooperate with the matching member 142 to fix the anti-theft member 141 on the connecting member 121. In one embodiment, the matching member 142 is substantially a hollow cylinder. In one embodiment, the positioning member 1412 is substantially a spherical pin. It can be understood that the anti-theft member 141 can be arranged at different angles, so as to connect with the first protrusion 1331 in a different manner.

Referring to FIG. 3, the latch mechanism 10 further includes a plurality of first adhering members 15 arranged at two ends of the fixing members 131 for suctioning the unlocking mechanism 20. In one embodiment, the first adhering member 15 is made of a magnetic material, and there are four first adhering members 15.

Figure 7:
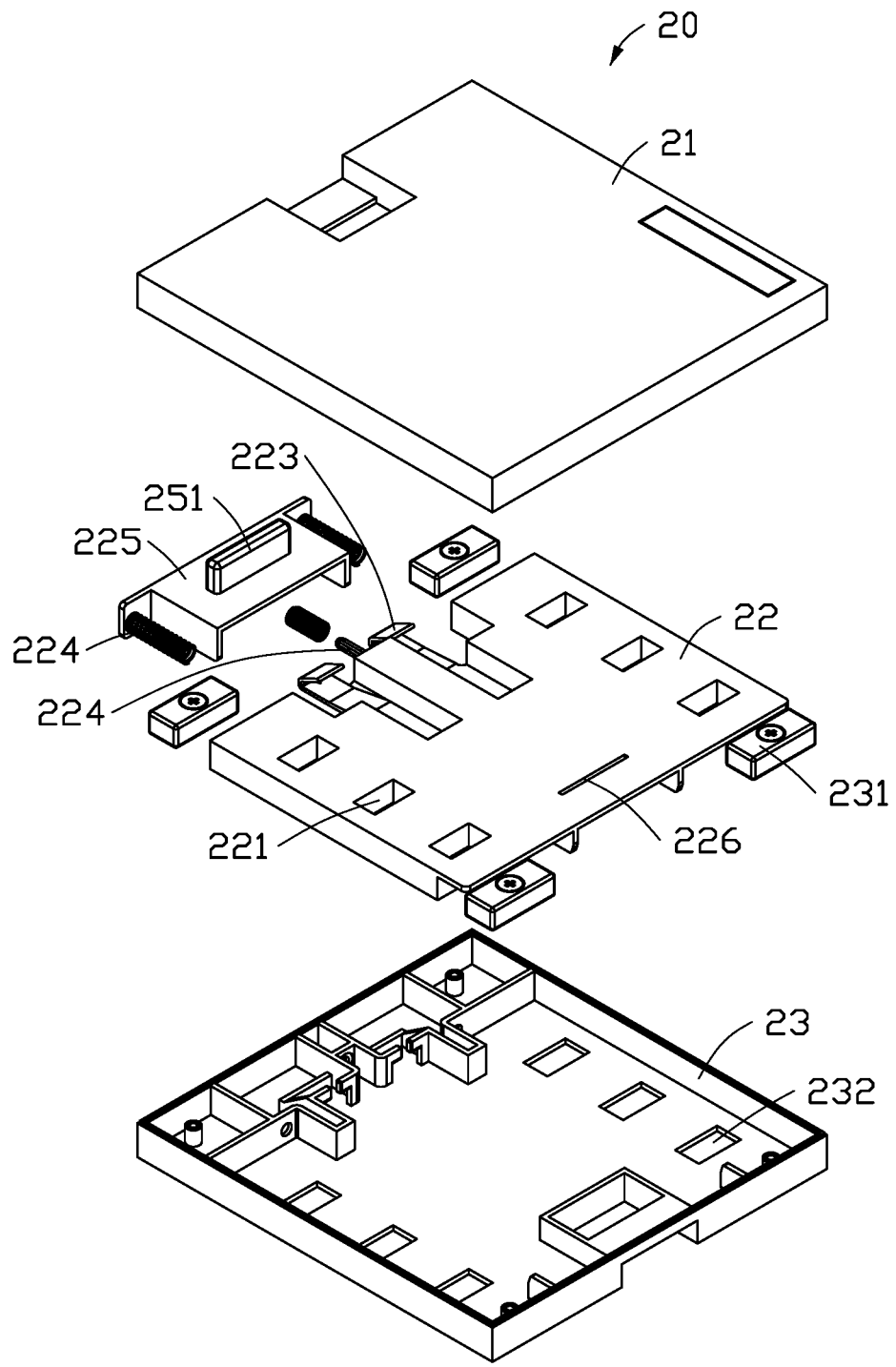
FIG. 7 is a schematic diagram of an unlocking module of the anti-theft lock.

Referring to FIG. 7, the unlocking mechanism 20 includes a first plate 21, a second plate 22, and a third plate 23. The first plate 21 is coupled to the third plate 23, and the second plate 22 is slidably received in the third plate 23.

Specifically, the second plate 22 is provided with a plurality of first grooves 221. Each of the first grooves 221 is used to accommodate a magnetic member (not shown). In one embodiment, the magnetic member is a magnet. In operation, the magnetic member arranged in the first groove 221 and the magnetic member arranged in the receiving chassis 133 have opposite or the same magnetic poles, so that the receiving chassis 133 swings and moves toward or away from the anti-theft member 141 under the action of the third torsion spring 134.

The second plate 22 is further provided with a third protrusion 222, two second hooks 223, elastic members 224, a first switch 225, and a second switch 226. The third protrusion 222 is provided on one side of the second plate 22 and used to cooperate with the elastic members 224 to abut against the first switch 225 under an elastic force of the elastic members 224. The second hooks 223 are coupled to one end of the second plate 22 and respectively arranged on two sides of the third protrusion 222. The second plate 22 is driven by the first switch 225 to lock into a limit portion (not shown) of the first plate 21. In one embodiment, the elastic member 224 is a spring, and there are three elastic members 224. One elastic member 224 is sleeved on the third protrusion 222, and the other two elastic members 224 abut against the first switch 225. The first switch 225 can be slidably received in the third plate 23, and the first switch 225 includes a control portion 2251 that passes through the first plate 21 for controlling the elastic members 224 to compress or expand. The second switch 226 is arranged at one end of the second plate 22 away from the second hooks 223. The second switch 226 is partially received in the third plate 23. By pushing the second switch 226, the second plate 22 is moved toward the first switch 225. The third plate 23 is provided with second adhering members 231. The second adhering members 231 are arranged at four corners of the third plate 23 for adhering to the first adhering member 15 to make the unlocking mechanism 20 be fixed to the top cover 200. The third plate 23 is provided with a plurality of second through holes 232 for receiving magnetic members. In one embodiment, the number of the second through holes 232 is six, and the second through holes 232 are symmetrically arranged on the third plate 23 in pairs.

When assembling the top cover 200 and the chassis 300, guide pins (not shown) provided on an edge of the top cover 200 slide along slots (not shown) provided around the chassis 300, thereby engaging the first hook 1111 with the first through hole, and the first torsion spring 113 is elongated, so that the top cover 200 cannot be moved and is locked with the chassis 300. When the unlocking mechanism 20 is used for unlocking, the unlocking mechanism 20 is first turned over so that the third plate 23 with the magnetic members in the second through holes 232 faces upward. Then, the second switch 226 is pushed to make the second plate 22 slide and abut against the first switch 225, so that the magnetic members fall into the first grooves 221, the second hook 223 is clamped onto the third plate 23, and the magnetic members are held in the second plate 22. Then the unlocking mechanism 20 is turned over so that the first plate 21 faces upwards, and the unlocking mechanism 20 is placed on the top cover 200 so that the second adhering members 231 provided on the third plate 23 attract the first adhering members 15 to hold the unlocking mechanism 20 on the top cover 200. The receiving chassis 133 swings under the action of the magnetic members of the second plate 22. When the first protrusion 1331 of the receiving chassis 133 corresponds in position to the through groove 1411 of the anti-theft member 141, the latch 122 starts to move under the action of the second torsion spring 123, and the bent portion 1221 contacts the baffle 112 and pushes the baffle 112, so that under the action of the first torsion spring 113, the bent portion 1221 moves away from the first hook 1111, so as to realize unlocking.

In one embodiment, corresponding marks or symbols are provided on the first plate 21 or the third plate 23 so that the unlocking mechanism 20 is arranged on the top cover 200 in a correct orientation.

Referring to FIG. 8, FIG. 9, FIG. 13, and FIG. 14, in another embodiment, a latch mechanism 30 includes engaging members 31, a latch module 32, magnetic modules 33, fixing modules 34, a first cover plate 35, and the second cover plate 36. The engaging member 31 is coupled to the chassis 300. The magnetic module 33 and the fixing module 34 are coupled to the latch module 32. The latch module 32 is coupled to the first cover plate 35 and the second cover plate 36. The first cover plate 35 and the second cover plate 36 are coupled to each other to substantially form a chassis structure. The second cover plate 36 is provided with a plurality of accommodating portions (not shown). The accommodating portions are used for accommodating the fixing modules 34. In one embodiment, the accommodating portions are substantially rectangular. In one embodiment, the first cover plate 35 and the second cover plate 36 are coupled together by bolts, and the second cover plate 36 is fixedly coupled to the top cover 200 by bolts.

Figure 9:
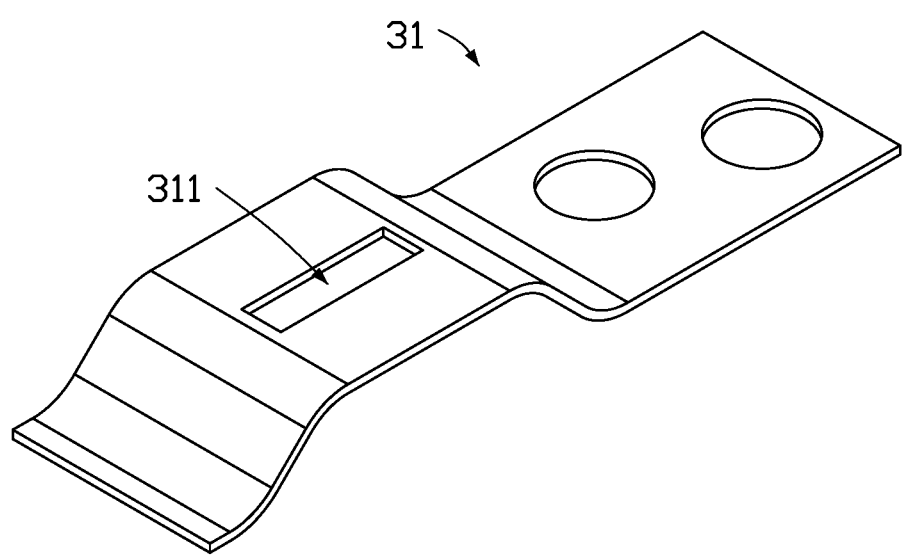
FIG. 9 is a schematic diagram of an engaging member of the latch mechanism in FIG. 8.

Refer to FIG. 9, the engaging member 31 is a non-planar structure. The engaging member 31 is provided with an engaging groove 311, and the engaging groove 311 is used to cooperate with the latch module 32. In one embodiment, there are two engaging members 31, which are respectively provided on two adjacent end surfaces of the chassis 300 and coupled to the chassis 300 by bolts.

Figure 10:
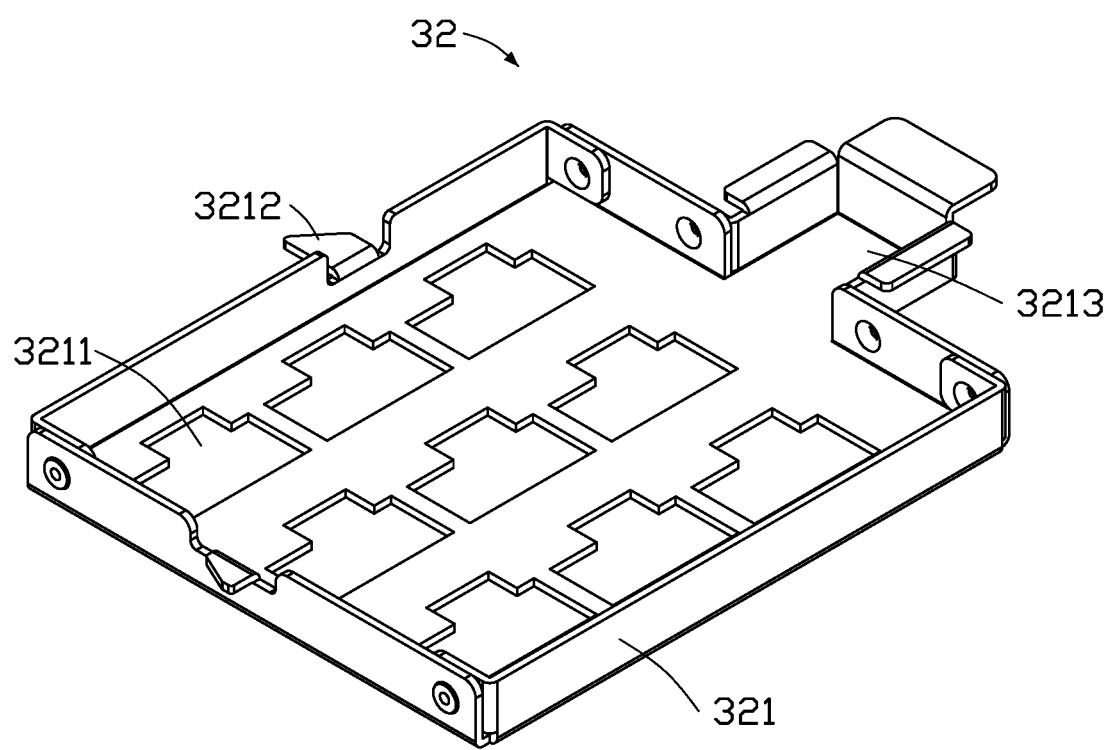
FIG. 10 is a schematic diagram of a latch mechanism according to another embodiment.

Referring to FIG. 10, the latch module 32 includes a connecting member 321, and the connecting member 321 is engaged with the engaging member 31 to realize a locking connection between the top cover 200 and the chassis 300. Specifically, the connecting member 321 is provided with a plurality of third through holes 3211, and the third through holes 3211 are used to accommodate the magnetic modules 33 and the fixing modules 34. The connecting member 321 is further provided with a hook 3212, and the hook 3212 is used for inserting into the engaging groove 311 to hook onto the engaging member 31. One end of the connecting member 321 is provided with an unlocking switch 3213. The unlocking switch 3212 is pulled down by an external force when in use to drive the connecting member 321 to move. In one embodiment, the connecting member 321 is substantially in the shape of a "冂" structure.

Figure 8:
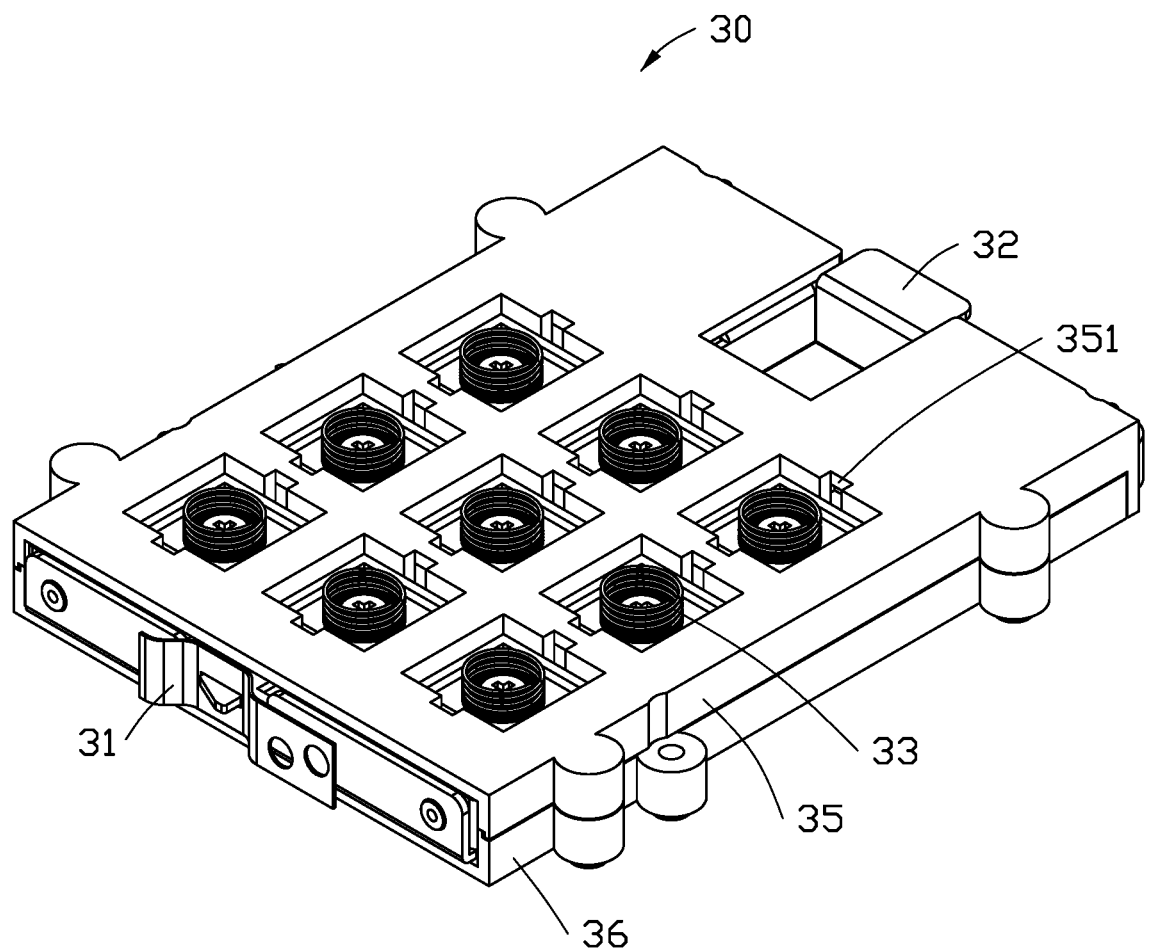
FIG. 8 is a schematic structural diagram of a latch mechanism according to another embodiment of the present disclosure.
Figure 11:
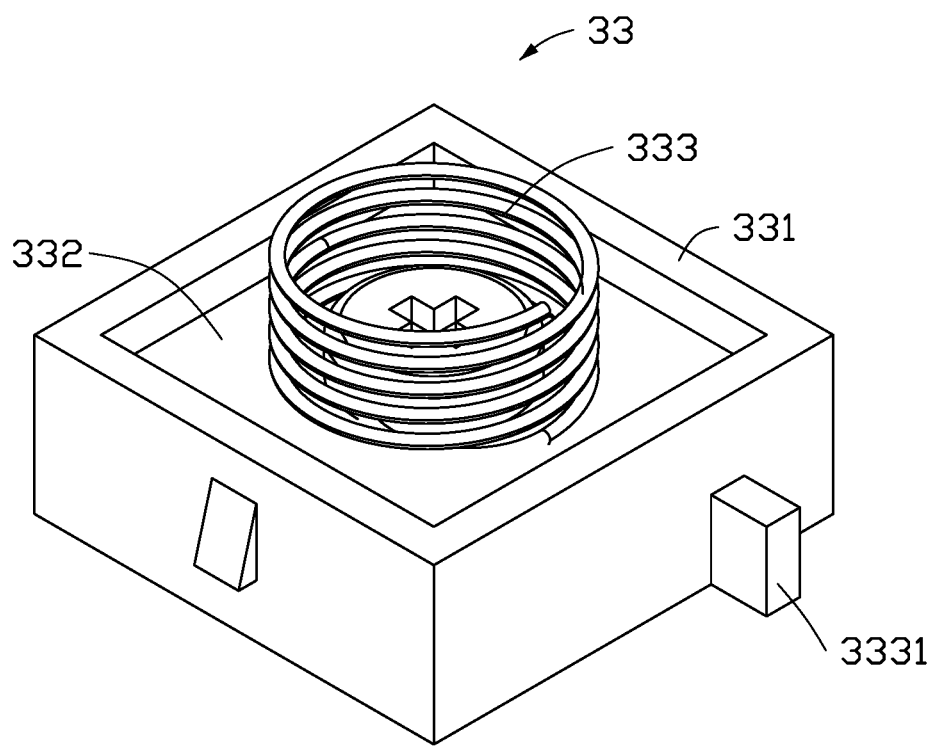
FIG. 11 is a schematic diagram of a magnetic module according to another embodiment.
Figure 12:
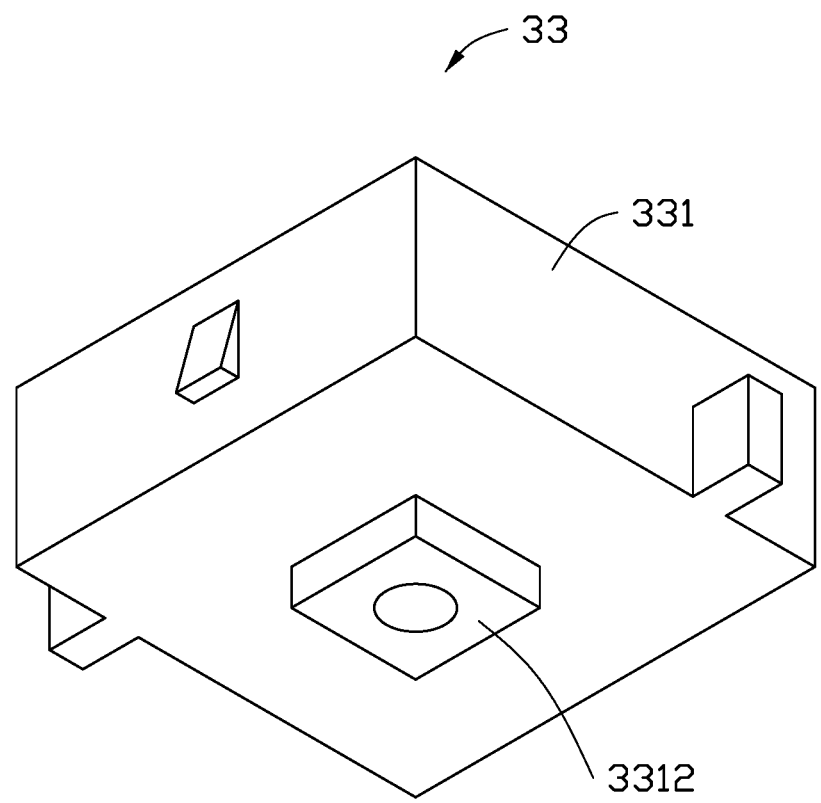
FIG. 12 is similar to FIG. 11, but showing the magnetic module from another angle.

Referring to FIGS. 8, 11, and 12, the magnetic module 33 includes a frame 331, a magnetic member 332 accommodated in the frame 331, and an elastic member 333 abutting against the magnetic member 332. The frame 331 is provided with a plurality of fourth protrusions 3311, and the fourth protrusions 3311 are used to cooperate with a mounting portion 351 provided on the first cover plate 35, so that the frame 331 is received in the first cover plate 35. The frame 331 is further provided with a first connecting portion 3312 protruding from one end of the frame 331 adjacent to the connecting member 321 for engaging with the fixing module 34. In one embodiment, the fixing module 34 is substantially a rectangular parallelepiped structure. The magnetic member 332 is accommodated in the frame 331. In one embodiment, the magnetic member 332 is a magnet, and the magnetic member 332 is substantially a hollow cylinder. One end of the elastic member 333 abuts against one end of the magnetic member 332 away from the connecting member 321, and another end of the elastic member 333 abuts against the top cover 200. In one embodiment, the elastic member 333 is a spring, and there are two elastic members 333 stacked together to enhance elasticity.

Figure 13:
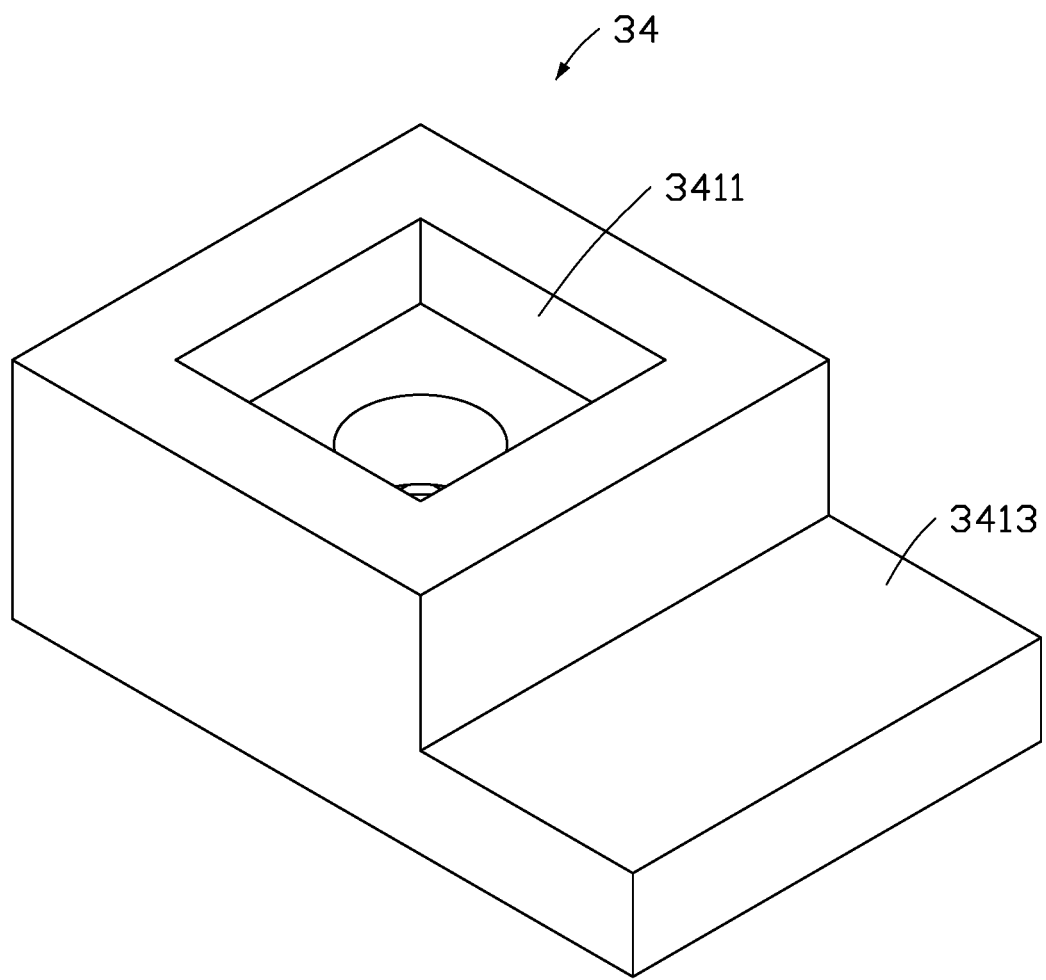
FIG. 13 is a schematic diagram of a fixing module according to another embodiment.
Figure 14:
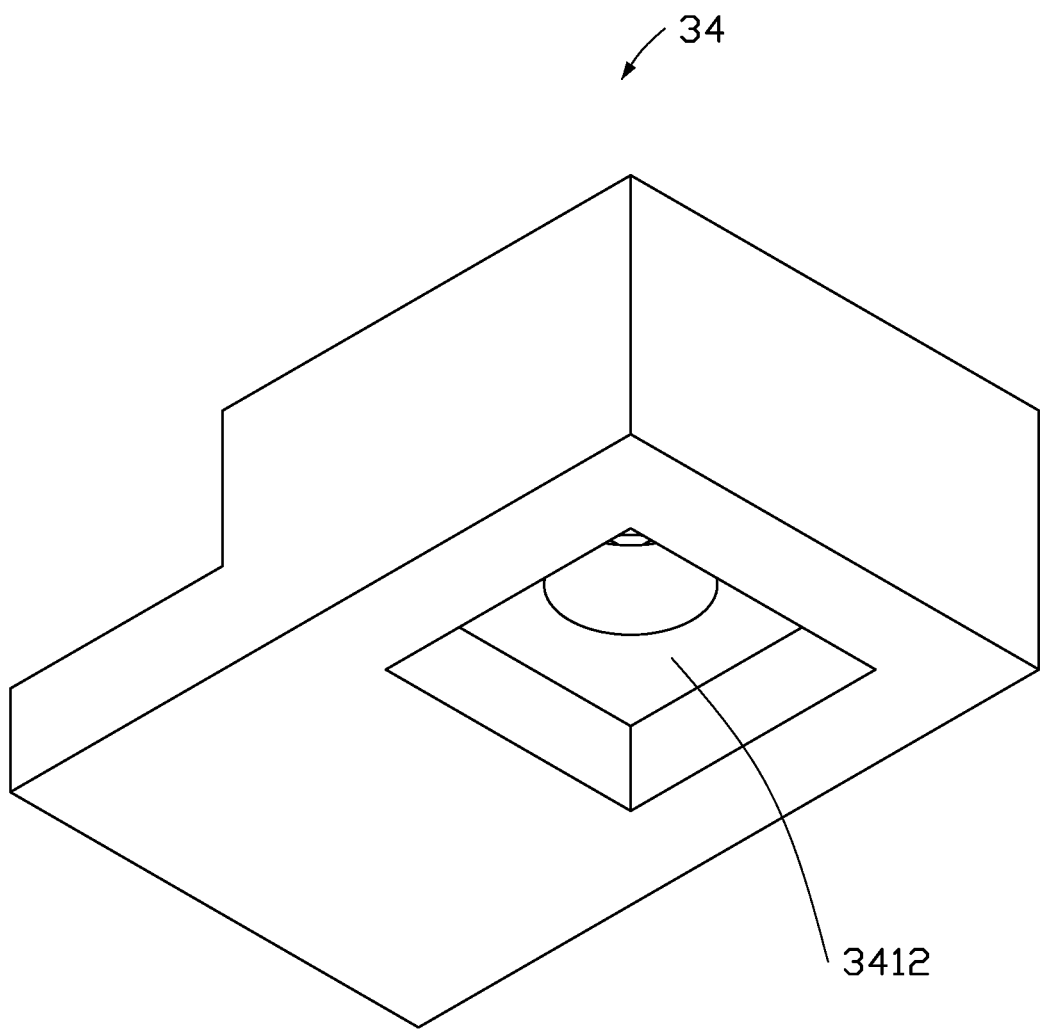
FIG. 14 is similar to FIG. 13, but showing the fixing module from another angle.

Referring to FIG. 13 and FIG. 14, the fixing module 34 includes a plurality of anti-theft members 341. The anti-theft members 341 are coupled to the frame 331. Specifically, each anti-theft member 341 is provided with a second groove 3411 on a first surface of the anti-theft member 341 and a third groove 3412 on a second surface of the anti-theft member 341 opposite to the first surface. The second groove 3411 and the third groove 3412 are used to receive the first connecting portion 3312. It can be understood that the frame 331 and the anti-theft member 341 have two connection modes. The anti-theft member 341 further includes a first holding portion 3413. When the first holding portion 3413 is received in the third through hole 3211, the connecting member 321 cannot move. It can be understood that different connection modes can be used to correspond to different unlocking modes to improve security.

Figure 15:
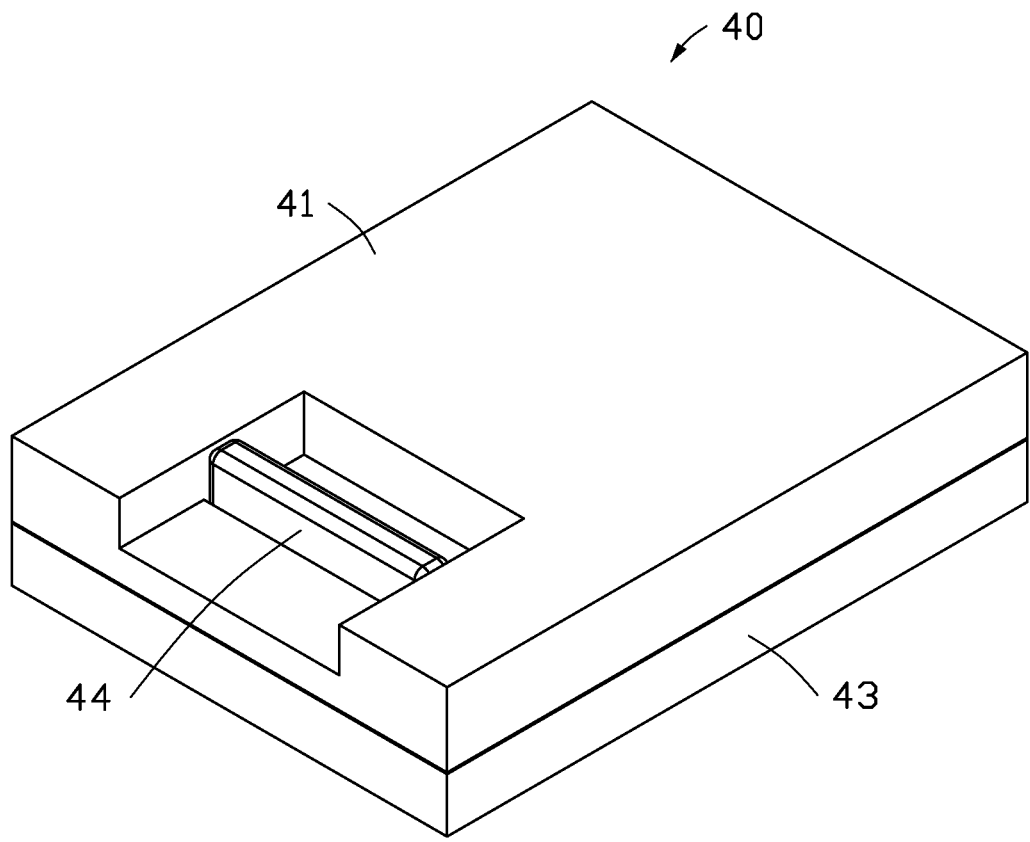
FIG. 15 is a schematic diagram of an unlocking mechanism according to another embodiment.
Figure 16:
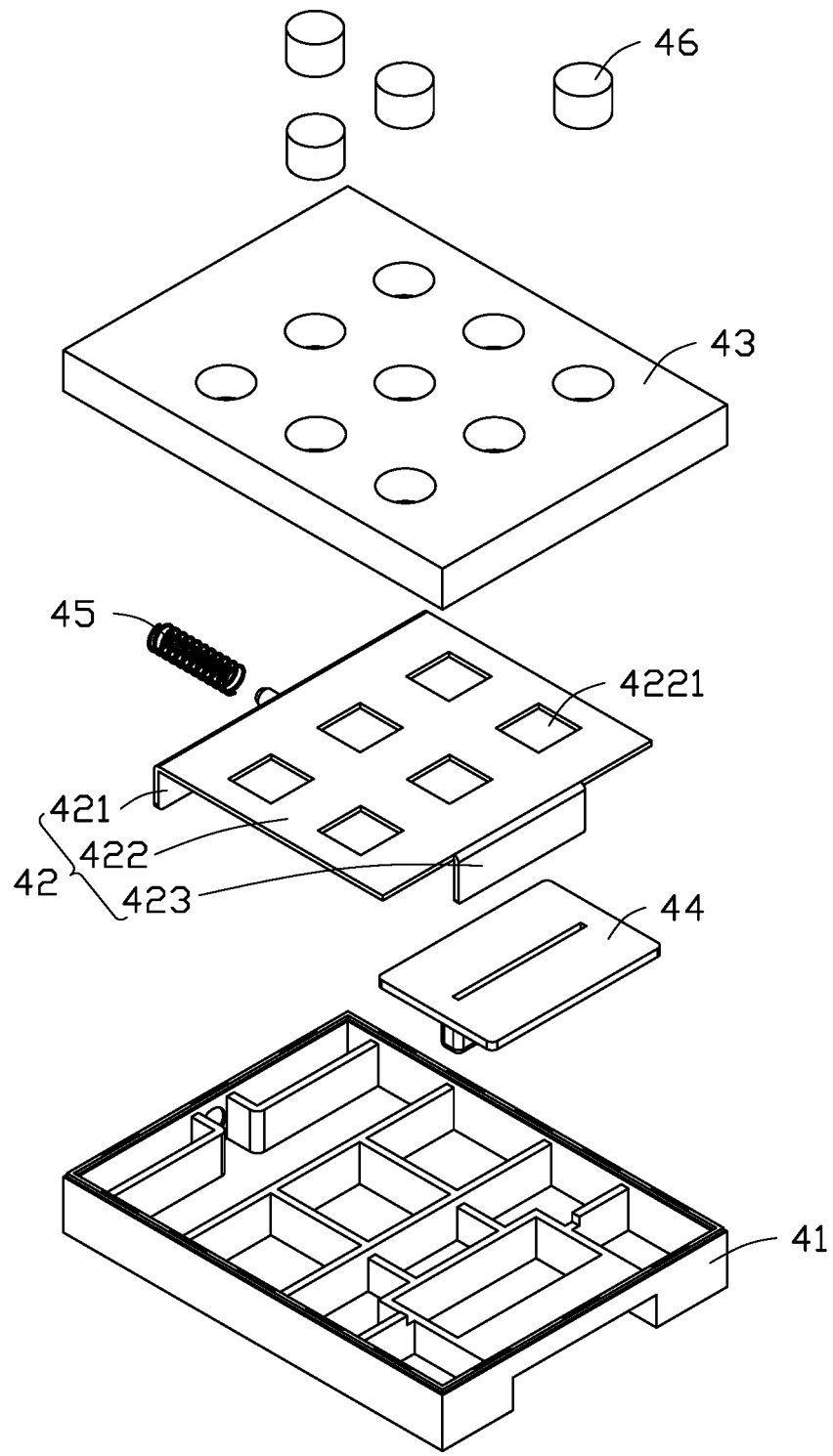
FIG. 16 is an exploded schematic diagram of the unlocking mechanism in FIG. 15.

Referring to FIG. 15 and FIG. 16, the unlocking mechanism 40 includes a first plate 41, a second plate 42, a third plate 43, an unlocking switch 44, an elastic member 45, and a magnetic member 46. The first plate 41 is coupled to the third plate 43, and the second plate 42 and the unlocking switch 44 are slidably accommodated in the first plate 41. The second plate 42 includes an abutting portion 421, a second connecting portion 422, and a second holding portion 423. The abutting portion 421 and the second holding portion 423 are coupled to the second connecting portion 422 and symmetrically arranged on the second connecting portion 422. The abutting portion 421 abuts against the elastic member 45. The second holding portion 423 is clamped to the unlocking switch 44, and the unlocking switch 44 is toggled to make the second plate 42 move in the first plate 41. The second connecting portion 422 is provided with a plurality of fourth through holes 4221. The third plate 43 is provided with a plurality of fourth grooves 431, and the fourth grooves 431 are used to accommodate the magnetic members 46. In one embodiment, the second plate 42 is made of magnetic material.

When the unlocking mechanism 40 is in use, the third plate 43 abuts against an end of the top cover 200 away from the latch mechanism 30. The magnetic members 46 are first received in the fourth grooves 431. Since the second plate 42 has magnetism, the magnetic members 46 are attracted to the third plate 43, and then the third plate 43 is attached to the top cover 200. By moving the unlocking switch 44, the second plate 42 is driven to move, and a magnetic force of the magnetic members 46 is lost due to the fourth through holes 4221 provided in the second plate 42, so that the magnetic members 46 fall onto the top cover 200. Due to the magnetic force of the magnetic members 46, the magnetic members 332 arranged in the frame 331 are attracted or repelled by the magnetic members 46, which causes the anti-theft member 341 to move toward or away from the top cover 200. When the first holding portion 3413 of the anti-theft member 341 is moved away from the second plate 42, the unlocking switch 44 is moved to move the second plate 42, and then the hook 3212 is separated from the engaging groove 311, thereby achieving unlocking.

It should be noted that when selecting and setting the above magnetic members, it is necessary to set the positive and negative pole directions, so that different unlocking passwords can be created by setting different magnetic members according to different rules, which is convenient for regular replacement and improves safety.

The anti-theft lock 100 described above may be applied in a server.

A data processing device may include the above-mentioned server. Specifically, the data processing device may also include a personal computer, a workstation, and the like.

The anti-theft lock 100, the chassis, and the data processing device use the performance of magnetic members through the cooperation of the latch module and the unlocking module. Thus, no power is needed, and a magnetic pole direction of the magnetic members can be changed to facilitate changing the password.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. An anti-theft lock for locking a top cover and a chassis, the anti-theft lock comprising:
    a latch mechanism; and
    an unlocking mechanism; wherein:
    the latch mechanism comprises an engaging member, a latch module, a fixing module, and a magnetic module;
    the engaging member is arranged on the chassis, and the engaging member is provided with a first hook configured to hook onto the latch;
    the latch module comprises a connecting member and a latch coupled to the connecting member;
    the connecting member is movably arranged on the top cover;
    a slot is defined on the latch;
    the first hook is inserted into or out of the slot through movement of the connecting member;
    the fixing module is coupled to the connecting member;
    the magnetic module is arranged on the top cover and is used to cooperate with the fixing module to control movement of the connecting member;
    the unlocking mechanism comprises a plurality of magnetic members;
    the plurality of magnetic members are attracted to or repelled from the magnetic module so that the magnetic module fixes or loosens the connecting member; and
    when the connecting member is loosened and moved, the latch is disengaged from and separated from the engaging member.

2. The anti-theft lock of claim 1, wherein:
    the engaging member comprises an engaging body fixed on the top cover; and
    the engaging body is provided with the first hook.

3. The anti-theft lock of claim 1, wherein:
    the magnetic module comprises a frame and magnetic members accommodated in the frame;
    the frame is coupled to the fixing module; and
    the frame and the fixing module are accommodated in a third through hole defined in the connecting member.

4. The anti-theft lock of claim 3, wherein:
    a first surface of the fixing module is provided with a second groove, and a second surface of the fixing module opposite the first surface is provided with a third groove; and
    the second groove and the third groove are configured to receive the frame.

5. The anti-theft lock of claim 2, wherein:
    the engaging member further comprises a baffle and a first torsion spring;
    the baffle is hinge-coupled to the engaging body;
    the first torsion spring is arranged on two ends of the baffle;
    when the latch is away from the engaging body, the first torsion spring rotates so that the baffle pushes the latch.

6. The anti-theft lock of claim 2, wherein:
    a gap is define between the top cover and the first hook, and
    when the first hook is out of the slot, the slot is located in the gap between the top cover and the first hook.

7. The anti-theft lock of claim 5, wherein:
    one end of the latch away from the connecting member is provided with a bent portion; and
    the bent portion is configured to engage with the first hook.

8. The anti-theft lock of claim 7, wherein:
    the magnetic module further comprises a fixing member, a connecting shaft, and a receiving chassis;
    the fixing member is coupled to the top cover;
    the receiving chassis is hinge-coupled to the fixing member through the connecting shaft; and
    the receiving chassis accommodates the magnetic members.

9. The anti-theft lock of claim 8, wherein:
    the receiving chassis comprises a first protrusion provided at an end of the receiving chassis adjacent to the connecting member;
    the fixing module comprises an anti-theft member coupled to the connecting member;
    the anti-theft member is provided with a through groove;
    when the latch is engaged with the engaging member, the first protrusion abuts against the anti-theft member;
    the first protrusion is used to restrict movement of the anti-theft member; and
    when unlocked, the first protrusion is engaged with the through groove and moved within the through groove, so that the latch moves.

10. The anti-theft lock of claim 9, wherein:
    the latch mechanism further comprises a first adhering member provided at two ends of the fixing member;
    the first adhering member is used to adhere to the unlocking mechanism to fix a position of the unlocking mechanism.

11. The anti-theft lock of claim 10, wherein:
the unlocking mechanism is further provided with a second adhering member used to adhere to the first adhering member.

12. An anti-theft lock comprising:
an engaging member arranged on a chassis, and the engaging member is provided with a first hook configured to hook onto the latch;
a latch module movably arranged on a top cover, and a slot is defined on the latch module;
a fixing module coupled to the latch module;
a magnetic module arranged on the top cover and used to cooperate with the fixing module to control movement of the latch module; and
an unlocking mechanism comprising a plurality of magnetic members, wherein:
the first hook is inserted into or out of the slot through movement of the latch module;
the plurality of magnetic members attracted to or repelled from the magnetic module so that the magnetic module fixes or loosens the latch module; and
the latch module is loosened and moved to disengage from and separate from the engaging member.

13. A server comprising:
a top cover;
a chassis; and
an anti-theft comprising:
a latch mechanism; and
an unlocking mechanism; wherein:
the latch mechanism comprises an engaging member, a latch module, a fixing module, and a magnetic module;
the engaging member is arranged on the chassis, and the engaging member is provided with a first hook configured to hook onto the latch;
the latch module is movably arranged on the top cover;
a slot is defined on the latch;
the first hook is inserted into or out of the slot through movement of the latch module;
the fixing module is coupled to the latch module;
the magnetic module is arranged on the top cover and cooperate with the fixing module to control movements of the latch module;
the unlocking mechanism comprises a plurality of magnetic members;
the plurality of magnetic members is attracted to or repelled from the magnetic module so that the magnetic module fixes or loosens the latch module; and
when the latch module is loosened, the latch module is movable to disengage from and separate from the engaging member.

14. The server of claim 13, wherein:
the latch module comprises a connecting member and a latch coupled to the connecting member;
the connecting member is movably arranged on the top cover;
the engaging member comprises an engaging body fixed on the top cover; and
the engaging body is provided with the first hook.

15. The server of claim 13, wherein:
the magnetic module comprises a frame and magnetic members accommodated in the frame;
the frame is coupled to the fixing module; and
the frame and the fixing module are accommodated in a third through hole defined in the connecting member.

16. The server of claim 15, wherein:
a first surface of the fixing module is provided with a second groove, and a second surface of the fixing module opposite the first surface is provided with a third groove; and
the second groove and the third groove are configured to receive the frame.

17. The server of claim 14, wherein:
the engaging member further comprises a baffle and a first torsion spring;
the baffle is hinge-coupled to the engaging body;
the first torsion spring is arranged on two ends of the baffle;
when the latch is away from the engaging body, the first torsion spring is rotatable such that the baffle pushes the latch.

18. The server of claim 17, wherein:
one end of the latch away from the connecting member is provided with a bent portion; and
the bent portion is configured to engage with the first hook.

19. The server of claim 18, wherein:
the magnetic module further comprises a fixing member, a connecting shaft, and a receiving chassis;
the fixing member is coupled to the top cover;
the receiving chassis is hinge-coupled to the fixing member through the connecting shaft; and
the receiving chassis accommodates the magnetic members.

20. The server of claim 19, wherein:
the receiving chassis comprises a first protrusion provided at an end of the receiving chassis adjacent to the connecting member;
the fixing module comprises an anti-theft member coupled to the connecting member;
the anti-theft member is provided with a through groove;
when the latch is engaged with the engaging member, the first protrusion abuts against the anti-theft member;
the first protrusion restricts movements of the anti-theft member; and
when unlocked, the first protrusion is engaged with the through groove and movable in the through groove, such that the connecting member and the latch are movable.

* * * * *